(12) United States Patent
Bean et al.

(10) Patent No.: US 7,633,336 B2
(45) Date of Patent: Dec. 15, 2009

(54) AUDIO AMPLIFIER AND METHODS OF GENERATING AUDIO SIGNALS

(75) Inventors: Ronnie A. Bean, Brandon, MS (US);
Roy Clifton Jones, III, Plano, TX (US);
David J. Baldwin, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 108 days.

(21) Appl. No.: 11/844,860

(22) Filed: Aug. 24, 2007

(65) Prior Publication Data

US 2009/0054023 A1 Feb. 26, 2009

(51) Int. Cl.
*H03F 3/38* (2006.01)
(52) U.S. Cl. ........................................... 330/10
(58) Field of Classification Search .................. 330/10, 330/207 A, 251
See application file for complete search history.

(56) References Cited

U.S. PATENT DOCUMENTS

| | | | |
|---|---|---|---|
| 6,320,460 | B1 | 11/2001 | Meszlenyi |
| 7,078,964 | B2 * | 7/2006 | Risbo et al. ................ 330/10 |
| 7,319,763 | B2 * | 1/2008 | Bank et al. ................. 330/10 |
| 2004/0027196 | A1 | 2/2004 | Lambruschi et al. |
| 2004/0164792 | A1 | 8/2004 | Yokoyama |
| 2006/0250183 | A1 | 11/2006 | Zhao et al. |

OTHER PUBLICATIONS

Wikipedia: The Free Encyclopedia, "Pulse-Width Modulation," Wikimedia Foundation, Inc. retrieved on Jun. 22, 2007, <http://en.wikipedia.org/wiki/Pulse-width_modulation> (7 pages).
Wikipedia: The Free Encyclopedia, "Buck-Boost Converter," Wikimedia Foundation, Inc. retrieved on Feb. 25, 2007, <http://en.wikipedia.org/wiki/Buck-boost_converter> (8 pages).
Wikipedia: The Free Encyclopedia, "Boost Converter," Wikimedia Foundation, Inc. retrieved on Feb. 25, 2007, <http://en.wikipedia.org/wiki/Boost_converter> (10 pages).
Wikipedia: The Free Encyclopedia, "Switching Amplifier," Wikimedia Foundation, Inc. retrieved on Feb. 25, 2007, <http://en.wikipedia.org/wiki/PWM_amplifier> (2 pages).
Dolland, Carlisle, "High-Side Driver Feeds IGBTs and MOSFETs," Electronics Design Strategy, News, dated Nov. 23, 2000, retrieved from <http://www.edn.com/article/CA54572.html?ref=nbsa &q=high%2Dside+driver+feeds+igbts+and+mosfets> on Feb. 24, 2007, (3 pages).

(Continued)

*Primary Examiner*—Khanh V Nguyen
(74) *Attorney, Agent, or Firm*—John J. Patti; Wade J. Brady, III; Frederick J. Telecky, Jr.

(57) ABSTRACT

Audio amplifiers and methods of generating audio signals are disclosed. A disclosed example amplifier comprises a first driver to receive a first signal; a second driver to receive a second signal; a configurable signal delivery circuit; and a mode selector in communication with the first and second drivers to selectively configure the signal delivery circuit in a voltage boost mode or a voltage buck-boost mode based on a characteristic of the input signal.

25 Claims, 8 Drawing Sheets

OTHER PUBLICATIONS

Dallas Semiconductor Maxim, "Class D Amplifiers: Fundamentals of Operation and Recent Developments," Maxim Integrated Products, dated Dec. 15, 2006, (13 pages).

Williams, Travis, "Use Negative-Swing Analog Switches for Portable Audio," Automotive Design Line, dated Feb. 6, 2007, retrieved from <http://www.automotivedesignline.com/howto/197005066;jsessionid=SFDXYEAZLBCRYQSNDLQCKICCJUNN2JVN> on Feb. 25, 2007, (3 pages).

U.S. Appl. No. 11/728,883, filed on Mar. 27, 2007, Inventors: Jagadeesh Krishnan & Paul H. Fontaine, titled: Multi-Mode Class-D Amplifiers, not yet published, (51 pages).

* cited by examiner

AUDIO AMPLIFIER AND METHODS OF GENERATING AUDIO SIGNALS

TECHNICAL FIELD

The present disclosure relates generally to audio signal processing and, more particularly, to audio amplifiers and methods of generating audio signals.

BACKGROUND

In portable electronic devices having acoustic elements (e.g., cellular phones, two-way radios, etc.), advances in piezo-electric speakers have increased the audio fidelity experienced by end users. However, piezo-electric speakers generally require large voltages (e.g., greater than $10\,V_{RMS}$) to provide high fidelity audio. These high voltages present challenges in the context of portable devices, which generally use low voltage power sources to preserve battery power. Such devices have addressed this issue by employing a voltage booster, which, in turn, powers an amplifier to amplify the audio signal to power the piezo-electric speaker(s). Known audio amplifiers employ a coupling capacitor to drive a single ended load. Alternatively, the power amplifier may be provided with a regulator or a charge pump to provide a second negative voltage supply.

SUMMARY

A preferred embodiment of the present invention, accordingly, provides an apparatus to amplify an audio input signal. The apparatus comprises a pulse width modulator that receives an input signal and that generates a first and a second pulse-width modulated (PWM) signals by comparing the input signal to a reference signal; a first driver; a second driver; a signal delivery circuit that is coupled to each of the first and second drivers; and a mode selector that is coupled to the first driver, the signal delivery circuit, and the second drivers, wherein the mode selector selectively configures the signal delivery circuit to operate in a boost mode or in a buck mode based on at least in part on a characteristic of the input signal.

In accordance with a preferred embodiment of the present invention, the characteristic of the input signal is a voltage amplitude of the input signal.

In accordance with a preferred embodiment of the present invention, apparatus further comprises an inductor that is coupled to the signal delivery circuit.

In accordance with a preferred embodiment of the present invention, the signal delivery circuit comprises: a first transistor having a first condition in which the first transistor couples an energy storage device to a power supply and a second condition in which the first transistor is driven by the first signal; a first pass gate having a first state in which the first pass gate disconnects a first path between the first transistor and a load, and a second state in which the first pass gate is driven by the first signal; a second transistor having a first condition in which the second transistor couples the energy storage device to ground and a second condition in which the second transistor is driven by the second signal; and a second pass gate having a first state in which the second pass gate disconnects a second path between the second transistor and the load, and a second state in which the second pass gate is driven by the second signal.

In accordance with a preferred embodiment of the present invention, when the signal delivery circuit is in the voltage boost mode, the first transistor is in the first condition, the first pass gate is in the first state, the second transistor is in the second condition and the second pass gate is in the second state.

In accordance with a preferred embodiment of the present invention, when the signal delivery circuit is in the voltage buck-boost mode, the first transistor is in the second condition, the first pass gate is in the second state, the second transistor is in the first condition and the second pass gate is in the first state.

In accordance with a preferred embodiment of the present invention, a transducer in communication with the signal delivery circuit.

In accordance with a preferred embodiment of the present invention, wherein the transducer is a single sided device.

In accordance with a preferred embodiment of the present invention, a method to amplify an audio input signal is provided. The method comprises modulating the audio input signal to produce a first signal and a second signal by comparing the audio input signal to a reference signal; comparing a characteristic of the audio input signal to a reference; configuring a signal delivery circuit in a voltage boost mode or a voltage buck-boost mode based on the comparison; and producing an output signal using one of the first or the second signals.

In accordance with a preferred embodiment of the present invention, the first signal is a first pulse-width modulated signal, and the second signal is a second pulse-width modulated signal, and the first and second signals have opposite polarities.

In accordance with a preferred embodiment of the present invention, the output signal has a voltage greater than a voltage of a power supply.

In accordance with a preferred embodiment of the present invention, wherein configuring the signal delivery circuit in the voltage boost mode comprises: placing a first transistor in a state in which the first transistor couples an energy storage device to a power supply; placing a first pass gate in a state in which the first pass gate disconnects a first path between the first transistor and a load; placing a second transistor in a state in which the second transistor is driven by the second signal; and placing a second pass gate in a state in which the second pass gate is driven by the second signal.

In accordance with a preferred embodiment of the present invention, wherein configuring the signal delivery circuit in the voltage buck-boost mode comprises: placing the first transistor in a state in which the first transistor is driven by the first signal; placing the first pass gate in a state in which the first pass gate is driven by the first signal; placing the second transistor in a state in which the second transistor couples the energy storage device to ground; and placing the second pass gate in a state in which the second pass gate disconnects a second path between the second transistor and the load.

In accordance with a preferred embodiment of the present invention, transducing the output signal of the signal delivery circuit into a humanly audible sound.

In accordance with a preferred embodiment of the present invention, an apparatus is provided. The apparatus comprises an input interface that receives an input signal; a pulse width modulator that is coupled to input interface and that generates a first PWM signal and a second PWM signal based at least in part on a comparison of an output from the input interface with a reference signal; a mode selector that is coupled to the input interface and to the pulse width modulator; a first driver that is coupled to the mode selector, wherein the first driver receives the first PWM in a buck mode, and wherein the first driver receives a logic level indicating a boost mode during the boost mode; a second driver that is coupled to the mode selector, wherein the second driver receives the second PWM in the boost mode, and wherein the first driver receives a logic level indicating the buck mode during the buck mode; and a signal delivery circuit that is coupled to the first driver and the second driver.

In accordance with a preferred embodiment of the present invention, wherein the apparatus further comprises an inductor that is coupled to the signal delivery circuit.

In accordance with a preferred embodiment of the present invention, wherein the mode selector further comprises: a comparator that is coupled to the input interface; a first OR gate that is coupled to the comparator and the pulse width modulator, wherein the first OR gate receives the first PWM signal; an inverter that is coupled to the comparator; and a second OR gate that is coupled to the inverter and the pulse width modulator, wherein the second OR gate receives the second PWM signal.

In accordance with a preferred embodiment of the present invention, wherein the signal delivery circuit further comprises: a first transistor having a first passive electrode, a second passive electrode, and a control electrode, wherein the control electrode of the first transistor is coupled to the first driver, and wherein the first driver actuates the first transistor during the boost mode, and wherein the first driver applies the first PWM signal during the buck mode; and a second transistor having a first passive electrode, a second passive electrode, and a control electrode, wherein the control electrode of the second transistor is coupled to the second driver, and wherein the second driver actuates the second transistor during the buck mode, and wherein the first driver applies the second PWM signal during the boost mode.

In accordance with a preferred embodiment of the present invention, wherein the apparatus further comprises an inductor that is coupled to the second passive electrode of the first transistor and the first passive electrode of the second transistor.

In accordance with a preferred embodiment of the present invention, wherein the signal delivery circuit further comprises: a first pass gate that is coupled to the first driver and to the inductor; a second pass gate that is coupled to the second driver and to the inductor; a reverse bias diode that is coupled to the first pass gate; and a forward bias diode that is coupled to the second pass gate.

In accordance with a preferred embodiment of the present invention, wherein the input interface further comprises: a first integrator that receives the input signal; a second integrator that is coupled to the first integrator; an amplifier that is coupled to the second integrator.

In accordance with a preferred embodiment of the present invention, wherein the pulse width modulator further comprises: a first comparator that is coupled to the input interface and that receives the reference signal; and a second comparator that is coupled to the input interface and that receives the reference signal.

In accordance with a preferred embodiment of the present invention, an apparatus is provided. The apparatus comprises an input interface including: a first integrator that receives an input signal; a second integrator that is coupled to the first integrator; and an amplifier that is coupled to the second integrator; a pulse width modulator including: a first comparator that is coupled to the amplifier, that receives a reference signal, and that generates a first PWM signal; and a second comparator that is coupled to the amplifier, that receives the reference signal, and that generates a second PWM signal; a mode selector including: a third comparator that is coupled to the amplifier; a first OR gate that is coupled to the comparator and the first comparator; an inverter that is coupled to the third comparator; and a second OR gate that is coupled to the inverter and the second comparator; a first driver that is coupled to the first OR gate, wherein the first driver receives the first PWM in a buck mode, and wherein the first driver receives a logic level indicating a boost mode during the boost mode; a second driver that is coupled to the second OR gate, wherein the second driver receives the second PWM in the boost mode, and wherein the first driver receives a logic level indicating the buck mode during the buck mode; an inductor; and a signal delivery circuit further including: a first transistor having a first passive electrode, a second passive electrode, and a control electrode, wherein the control electrode of the first transistor is coupled to the first driver, and wherein the second passive electrode of the first transistor is coupled to the inductor, and wherein the first driver actuates the first transistor during the boost mode, and wherein the first driver applies the first PWM signal during the buck mode; a second transistor having a first passive electrode, a second passive electrode, and a control electrode, wherein the control electrode of the second transistor is coupled to the second driver, and wherein the first passive electrode of the second transistor is coupled to the inductor, and wherein the second driver actuates the second transistor during the buck mode, and wherein the first driver applies the second PWM signal during the boost mode; a first pass gate that is coupled to the first driver and to the inductor; a second pass gate that is coupled to the second driver and to the inductor; a reverse bias diode that is coupled to the first pass gate; and a forward bias diode that is coupled to the second pass gate.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1A:
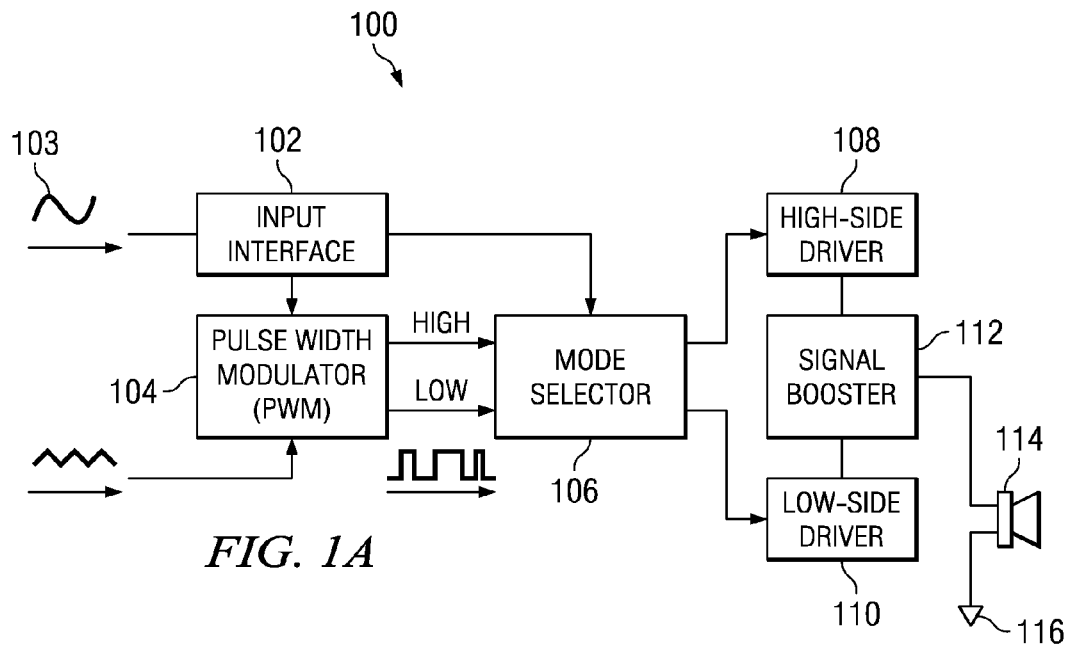
FIG. 1A is a block diagram of an example ground-referenced audio amplifier driving a speaker in accordance with a preferred embodiment of the present invention.

Refer now to the drawings wherein depicted elements are, for the sake of clarity, not necessarily shown to scale and wherein like or similar elements are designated by the same reference numeral through the several views.

Example ground-referenced audio amplifiers and methods of generating an audio signal are disclosed herein. Although the example methods and apparatus described herein generally relate to ground-referenced audio amplifiers for mobile applications, the disclosure is not limited to mobile applications. On the contrary, the teachings of this disclosure may be applied in any device which would benefit from circuitry that achieves an amplified output voltage above a supply voltage and/or that would benefit from an amplification circuit and/or method that can provide a ground referenced output signal to a single-ended load from a single supply.

Figure 1B:
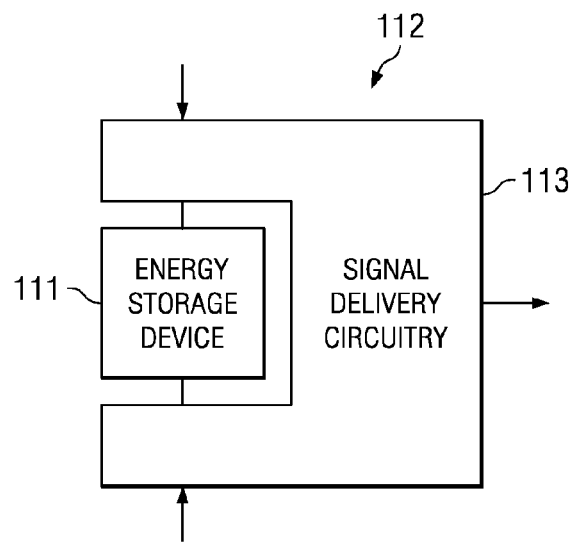
FIG. 1B illustrates the signal booster of FIG. 1A in greater detail.

In FIGS. 1A and 1B, an example ground-referenced audio amplifier 100 includes an input interface 102 to receive and filter an audio signal 103. The input interface 102 may utilize any suitable technique to prepare the signal 103 for further processing. For example, the input interface 102 may preprocess the signal 103 to reduce sensitivity to parameter variations, to level shift (e.g., Direct Current or DC bias) the input signal 103 to a desired level, to improve performance (e.g., noise, bandwidth, etc.), to increase high frequency performance, to improve stability, gain, etc. In the illustrated example audio amplifier, a second order control loop is utilized to improve performance of the audio amplifier by filtering switching noise, increasing gain, and increasing stability. Second order control loops of this type have been employed in class D amplifiers.

The input interface 102 of the illustrated example conveys the preprocessed audio signal to a pulse width modulator (PWM) 104. The PWM 104 may modulate the preprocessed audio signal received from the input interface 102 based on any technique (e.g., intersective, delta, sigma-delta, etc.). In the example of FIG. 1A, a triangle signal is provided as a reference signal to modulate the preprocessed audio signal to form a first PWM signal and a second PWM signal. The first PWM signal is based on a comparison of the preprocessed audio signal and the reference signal. The second PWM signal is based on an inverse comparison of the preprocessed audio signal and the reference signal. The first PWM signal is indicative of a characteristic (e.g., a voltage, a current, the power spectral density, etc) of the audio signal 103. The second PWM signal is also indicative of the characteristic (e.g., the amplitude and/or the power spectral density) of the audio signal 103. However, the characteristic represented by the second PWM signal is the inverse of the characteristic represented by the first PWM signal.

The first and the second PWM signals are conveyed to a mode selector 106. The mode selector 106 also receives the preprocessed audio signal via the input interface 102. Based on a characteristic of the preprocessed audio signal, the mode selector 106 determines whether the first PWM signal will be conveyed to a low-side output driver 110 or whether the second PWM signal will be conveyed to a high-side output driver 108. In other words, the mode selector 106 selects the output path of the example audio amplifier 100 based on a characteristic of the preprocessed audio signal. For example, if the mode selector 106 determines that the characteristic of the audio signal has a first state (e.g., the voltage of the preprocessed audio signal exceeds a threshold), the mode selector 106 conveys the first PWM signal to the high-side output driver 108. If the mode selector 106 determines that the characteristic of the preprocessed audio signal has a second state (e.g., the voltage of the preprocessed audio signal does not exceed the threshold), the mode selector 106 conveys the second PWM signal to the low-side output driver 110.

The selected one of the high-side output driver 108 and the low-side output driver 110 of the illustrated example configure a signal booster 112 to generate an output signal to be audibly presented to a user. In other words, when the low-side output driver 108 is selected, it causes the signal booster 112 to convert the first PWM signal into an output signal. When the high-side output driver is selected, it causes the signal booster 112 to generate an output signal based on the second PWM signal. When the high-side output driver 108 is selected, the low-side signal is not selected, and vice-versa.

Turning to FIG. 1B, the signal booster 112 comprises an energy storage device 111 (e.g., an inductor) and configurable signal delivery circuitry 113. When the high-side output driver 108 is selected, the driver 108 configures the signal delivery circuitry 113 into a first configuration to cause the energy storage device 111 to deliver a first voltage of a first polarity (e.g., negative) to a load 114. The first voltage is an amplified version of a corresponding portion of the audio input signal 103. When the low-side output driver 110 is selected, the driver 110 configures the signal delivery circuitry 113 to cause the energy storage device 111 to deliver a second voltage of a second polarity (e.g., positive) to the load 114. The second voltage is an amplified version of a corresponding portion of the audio input signal 103. When the signal delivery circuitry 113 is in the first configuration, the example amplifier 100 is configured in a voltage buck-boost mode. When the signal delivery circuitry 113 is in the second configuration, the example amplifier 100 is in a voltage boost mode.

Irrespective of which mode is selected, an output signal comprising an amplified version of the audio input signal 103 is delivered to the load 114. For the typical input audio signal 103, the amplifier will repeatedly transition between the buck-boost mode and the boost mode in order to produce the amplified output signal. Preferably, the load 114 is a transducer (e.g., a speaker such as a piezo-electric speaker, a distributed mode actuator, etc.) that converts the output signal into a humanly audible output. As shown, the amplifier 100 is able to drive the load 114 using a single voltage supply with a voltage of the output signal exceeding that voltage supply. This is particularly useful in low power applications such as portable electronics (e.g., cell phones, laptops, etc.) using piezo-electric speakers. Additionally, the ground-reference audio amplifier 100 may be implemented by a voltage booster.

Figure 2:
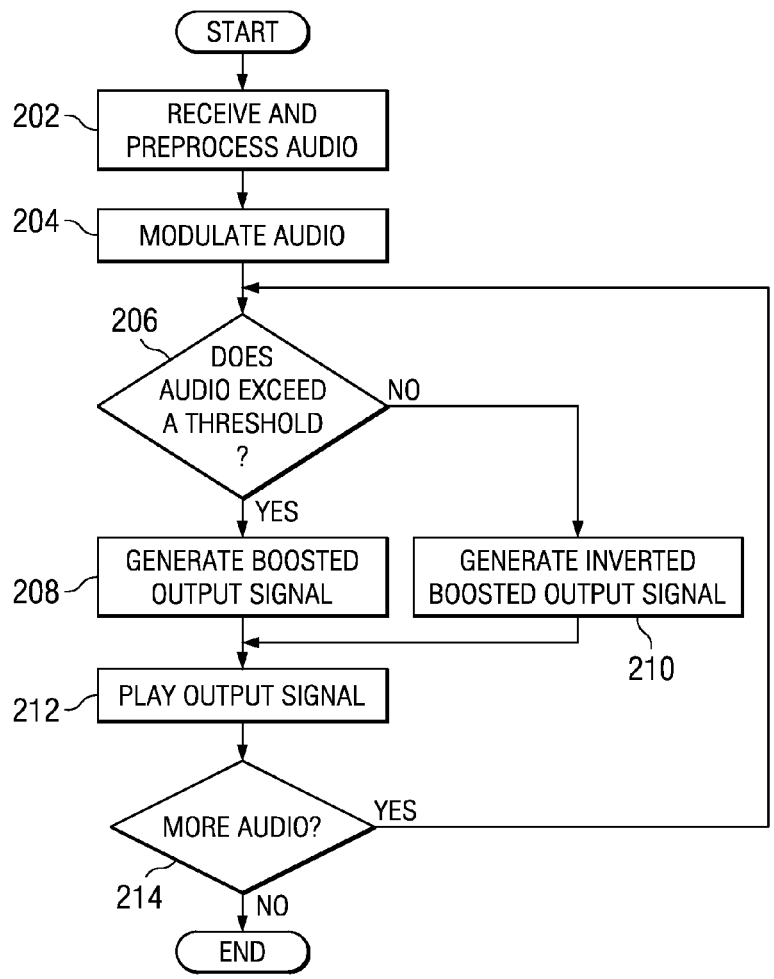
FIG. 2 is a flow diagram of an example method that may be used to implement the example ground-referenced audio amplifier of FIGS. 1A and 1B.

FIG. 2 is a flow chart of an example process 200 to audibly present an audio signal to a user of an example electronic device. In the example of FIG. 2, the example process 200 begins by receiving and preparing (e.g., level shifting, filtering, etc.) an audio signal 103 to be presented to a user (block 202). After preprocessing the audio signal, the audio signal is modulated to produce a first PWM signal and a second PWM signal (block 204). The first and second PWM signals are representative of at least some aspect of interest of the audio signal. After the first PWM signal and the second PWM signal are formed, the example process 200 determines if the portion of the preprocessed audio signal currently being prepared for reproduction at the load 114 exceeds a threshold (block 206).

If the noted portion of the preprocessed audio signal exceeds the threshold, the example process 200 forms a boosted output signal based on the first PWM signal (block 208). On the other hand, if the noted portion of the preprocessed audio signal does not exceed the threshold, the example process 200 forms a buck-boosted output signal based on the PWM modulated signal (block 210). After forming the boosted output signal or buck-boosted output signal, the output signal is audibly presented to a user (block 212). Control continues to loop through blocks 206-214 until there is no more audio signal to process.

Figure 3:
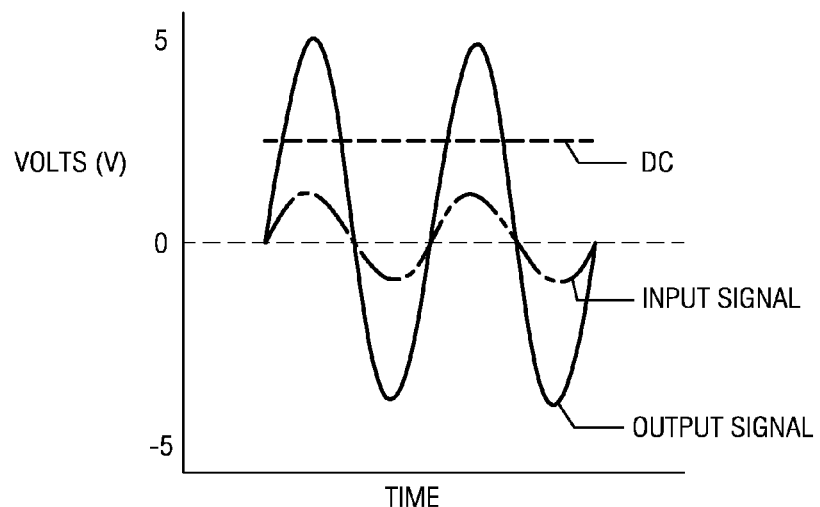
FIG. 3 illustrates an example simulated signal output by the example circuit of FIGS. 1A and 1B in response to an example input signal.

FIG. 3 illustrates an example output signal formed by the example audio amplifier 100 of FIG. 1A and/or FIG. 2 in response to an example input signal. In the example of FIG. 3, the input is an audio signal 103, and the output audio signal of the example method is an audio signal substantially corresponding to the audio signal, but with a larger voltage swing. In some examples, the audio amplifier 100 may distort the audio a small margin due to the devices of the audio amplifier 100 (e.g., noise of devices, non-linearities of devices, etc.). In the example of FIG. 3, the voltage of the power supply is shown by a dotted line labeled DC. As shown in FIG. 3, the amplifier 100 is able to produce a voltage above the voltage of the power supply and a voltage below the voltage of the low output signal (e.g., a ground).

Figure 4:
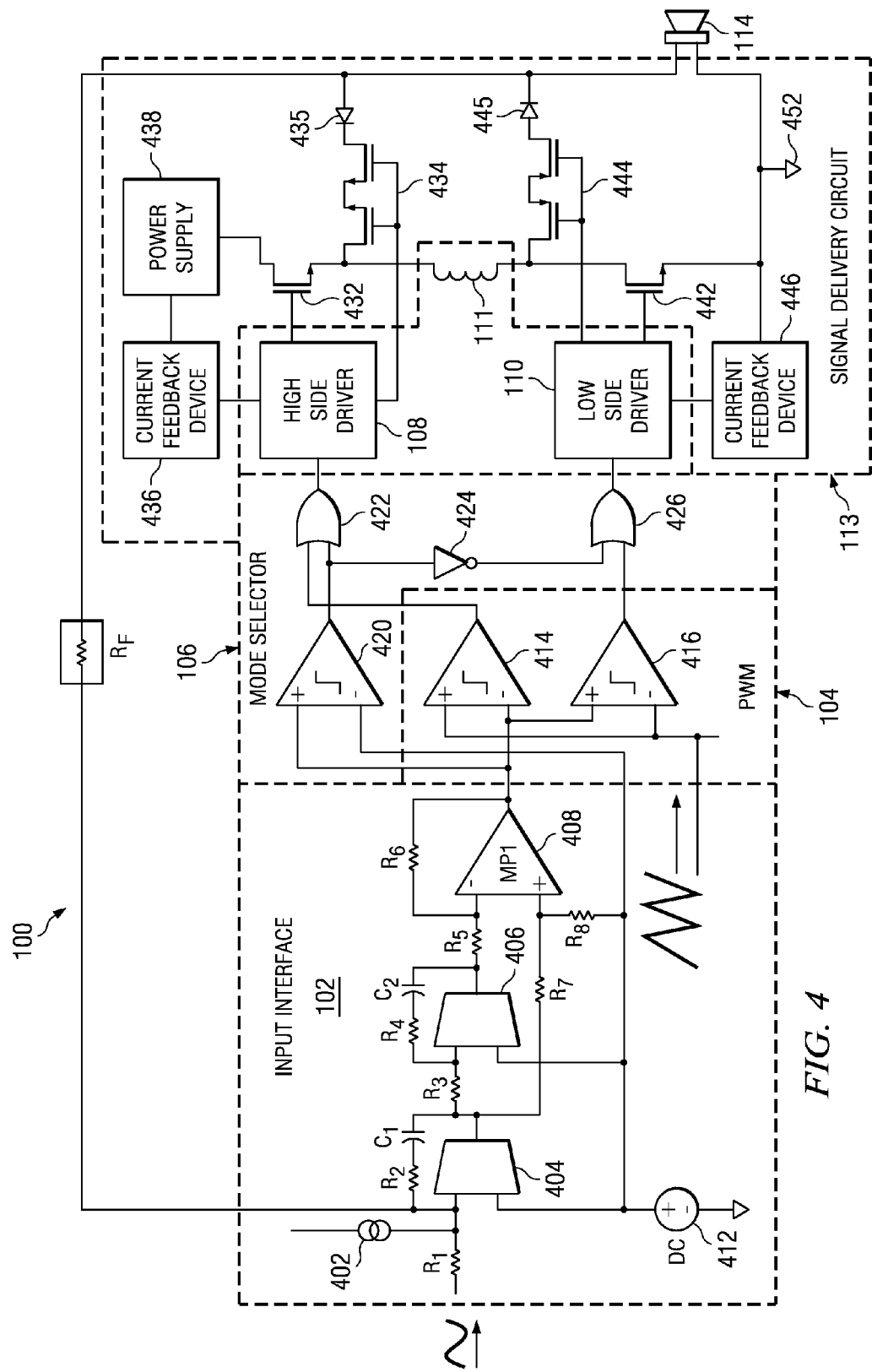
FIG. 4 is a schematic diagram of an example circuit implementing the ground-referenced audio amplifier 100 of FIGS. 1A and 1B.

Turning to FIG. 4, the ground-reference audio amplifier 100 is illustrated in more detail. The input interface 102 is generally formed by an input resistor $R_1$, a DC bias 402, a first integrator 404, a second integrator 406, and an amplifier 408. The audio signal is received by the input resistor $R_1$ and is level shifted by the DC current bias 402. In the example of FIG. 4, the audio signal is level shifted such that any DC component of the audio signal is located at zero or substantially zero volts. The first integrator 404 (which includes resistor $R_2$ and capacitor $C_1$) receives the level shifted audio signal via a first input terminal. The first integrator 404 also receives a DC bias voltage from DC voltage source 412 via a second input terminal. The DC voltage bias from source 412 may be implemented by any value (e.g., ½ $V_{DD}$, 5 volts, 3.3 volts, 0 volts, etc.). The output of the first integrator 404 is further coupled to a first input terminal of the second integrator 406 (through resistor $R_3$). The second integrator 406 is also coupled to source 412 at a second input terminal, and the second integrator includes resistor $R_4$ and capacitor $C_2$.

The amplifier 408 is coupled to the second integrator 406 at a first input terminal (through resistor $R_5$) and is coupled to the first integrator 404 at a second input terminal (through resistor $R_7$) The amplifier 408 amplifies the difference in the output signal from the first integrator 404 and the output signal from the second integrator 406 to develop the preprocessed audio signal that is provided to the PWM 104. Additionally, the second input terminal of amplifier is coupled to source 412 (through resistor $R_8$). Another preferable function of the amplifier 408 is filters the audio signal to reduce noise (e.g., switching noise, noise from the feedback, noise from devices, etc.). From the foregoing, it will be recognized that the input interface 102 implements a second order feedback network to improve performance (e.g., gain, stability, etc.) of amplifier 100

After the audio signal is pre-processed, the input interface 102 conveys the preprocessed audio signal to the PWM 104 and the mode selector 106. The PWM 104 is generally comprised of a first comparator 414 and a second comparator 416. The first comparator 414 receives the preprocessed audio signal of the input interface 102 via a first (e.g., negative) input and also receives a reference signal or ramp signal (e.g., a triangle wave) via a second (e.g., positive) input. The comparator 414 compares the voltage of the preprocessed audio signal to the voltage of the reference signal. If the voltage of the preprocessed audio signal exceeds the voltage of the reference signal, the comparator 414 outputs a high voltage (e.g., 3.3 volts). On the other hand, if the voltage of the preprocessed audio signal does not exceed the voltage of the reference signal, the comparator outputs a low voltage (e.g., 0 volts). As a result, the comparator 414 forms a first PWM signal (e.g., a pulse train having a series of high voltages and low voltages) indicative of a characteristic of the audio signal such as the power spectral density of the audio signal.

The second comparator 416 of the PWM 104 receives the reference signal via its first (e.g., negative) input and also receives the preprocessed audio signal of the input interface 102 via its second (e.g., positive) input. The second comparator 416 compares the voltage of the reference signal to the voltage of the preprocessed audio signal. If the voltage of the reference signal exceeds the voltage of the preprocessed audio signal, the second comparator outputs a high voltage (e.g., 3.3 volts). On the other hand, if the voltage of the reference signal does not exceed the voltage of the preprocessed audio signal, the comparator outputs a low voltage (e.g., 0 volts). As a result, the second comparator 416 forms a second PWM signal indicative of a characteristic of the audio signal (e.g., the power spectral density of the preprocessed audio signal). The voltage of the second PWM signal has an opposite polarity relative to the first PWM signal.

The first PWM signal and the second PWM signal are conveyed from the PWM 104 to the mode selector 106. The mode selector 106 is generally comprised of a comparator 420, OR gate 422, inverter 424, and OR gate 426. The comparator 420 is coupled to the amplifier 408 at one input terminal and to source 412 at its other input terminal so as to receive the DC voltage bias and the preprocessed audio signal from the input interface 102. Based on a comparison of the preprocessed audio signal and the DC bias voltage from source 412, the mode selector 106 selects the operating mode (or output path). If the voltage of the preprocessed audio signal exceeds the voltage of the DC bias from source 412, the comparator 420 outputs a high voltage (e.g., 3.3 volts), and if the voltage of the audio signal does not exceed the voltage of the DC bias 412, the comparator 420 outputs a low voltage (e.g., 0 volts). This output of the comparator 420 is then conveyed to OR gate 422 and to OR gate 426 (via inverter 424).

The output of OR gate 422 generally controls the high side driver 108, while OR gate 260 generally controls the low side driver 110. In addition to being coupled to comparator 420, OR gate 422 receives the first PWM signal from the comparator 414, and OR gate 426 receives the second PWM signal from comparator 416. Thus, when the output of the comparator 420 is high, OR gate 422 blocks the first PWM signal from comparator 414, and when the output of the comparator 420 is low, OR gate 422 passes the first PWM signal to high side driver 108. Additionally, when the output of the comparator 420 is low, the OR gate 426 blocks the second PWM signal from comparator 416, and when the output of the comparator 420 is high, OR gate 426 passes the second PWM signal to low side driver 110.

Thus, in operation, the mode selector 106 selects one of OR gates 422 or 426 to convey a high voltage, while the other OR gate 422 or 426 conveys the first or second PWM signal depending on the amplitude of the preprocessed audio signal. For example, if the voltage of the audio signal exceeds the voltage of the DC bias from source 412, the mode selector 106 selects OR gate 422 to convey a logic high voltage (e.g., 3.3 volts) and selects OR gate 426 to convey the second PWM signal. Conversely, if the voltage of the preprocessed audio signal does not exceed the voltage of the DC bias from source 412, the mode selector 106 selects OR gate 422 to convey the first PWM signal and selects OR gate 426 to convey a logic high voltage.

Each of the high side driver 108 and low side driver 110 is coupled to the signal deliver circuit 113. As shown, the signal delivery circuitry 113 generally includes a first controller switch 432, a pass gate 434, a diode 435, a current feedback device 436, a second controlled switch 442, a pass gate 444, a diode 445, and a current feedback device 446. The high side driver 108 receives the output of the OR gate 422. The driver 108 is coupled to the control terminal of the first controlled switch 432 via a first output and is also coupled to the control terminal of the pass gate 434 via a second output. The polarities of the first and second outputs of the driver 108 are opposite to one another. Preferably, the controlled switch 432 may be implemented by a laterally diffused metal-oxide semiconductor (LDMOS) transistor; however, any type of switch may be used. An output of the low side driver 110 is coupled to the gate of the second controlled switch 442. Preferably, the second controlled switch 442 is implemented by an LDMOS device. The drain of the second controlled switch 442 is coupled to the source of the first controlled switch 432 via the energy storage device 111. As shown, the energy storage device 111 is implemented by an inductor.

Figure 5A:
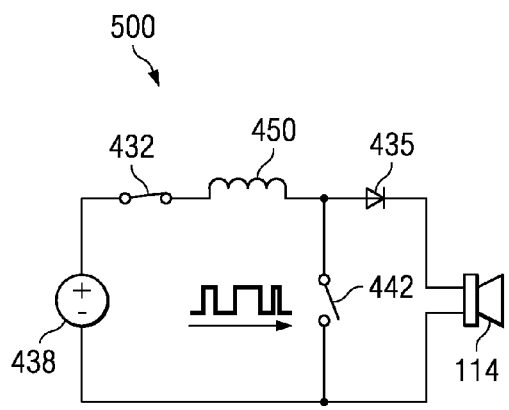
FIGS. 5A and 5B illustrate example equivalent circuits of the example voltage booster and voltage buck-booster of FIG. 4.
Figure 5B:
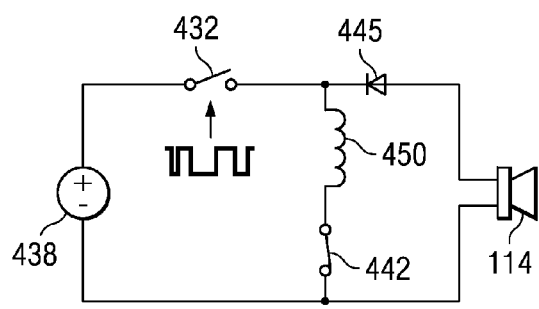

The first controlled switch 432 receives the first output of the driver 108 via its gate. The drain of the first controlled switch 432 is coupled to a power supply 438 and a feedback device 436. The feedback device 436 is further coupled to an input of the driver 108 to enable the driver 108 to limit the current. Limiting the current in this manner functions to limit the current through the energy storage device 111. Typically, the energy storage device 111 is implemented by a surface mounted inductor which can handle a limited amount of current. The source of the first controlled switch 432 is coupled to the pass gate 434 and the energy storage device 111. The pass gate 434 is formed by two N-channel metal-oxide semiconductor field effect transistors (MOSFET) having their sources coupled in series. The gates of the MOSFET devices forming the pass gate 434 receive the second output from the driver 108 to couple or decouple the energy storage device 111 to/from the load 114 via the diode 435, similar to a DC-DC converter or switched power supply as shown in FIG. 5B. The driver 108 controls the first controlled switch 432 and the pass gate 434 such that when the first controlled switch 432 is held on, the pass gates 434 are turned off, and when the first controlled switch 432 is being pulse width modulated (i.e., tracking the first PWM signal), the pass gates 434 are also being pulse width modulated (i.e., tracking the first PWM signal). As a result, when the driver 108 receives the first PWM signal, the first controlled switch 432 couples the power supply 438 with the energy storage device 111, and the pass gate 434 couples the source of the first controlled switch 432 with the load 114. In this state, the pass gate 434 is pulse width modulated to prevent current from flowing back from the load 114 into the first controlled switch 432. When the driver 108 receives a constant high voltage, the pass gate 434 is turned off and isolates the load 114 from the power supply 438. In this scenario, the energy storage device 111 is in series with the power supply 438 and the load 114 via a second pass gate 444 as explained further below.

The source of the second controlled switch 442 is coupled to ground 452 (e.g., a system ground, etc.). In the example of FIG. 4, the output terminal of the load 114 is also coupled to ground. The feedback device 446 is coupled to the source of the second controlled switch 442 to provide current feedback to the driver 110. The feedback device 446 is included to limit the maximum current provided via the driver 110. The drain of the second controlled switch 442 is coupled to the pass gate 444. In the example of FIG. 4, the pass gate 444 is formed by two P-channel MOSFET devices having their sources connected in series. The gates of the MOSFET devices implementing the pass gate 444 receive an output from the driver 110 to couple or decouple the energy storage device 111 to/from the load 114, similar to a DC-DC converter or switched power supply as shown in FIG. 5A. The driver 110 controls the second controlled switch 442 and the pass gates 444 such that the pass gates 444 are off when the second controlled switch is on, and the pass gates 444 are pulse width modulated (i.e., in accordance with the second PWM signal) when the second controlled switch 442 is pulse width modulated (i.e., also in accordance with the second PWM signal). As a result, when the pass gates 444 are held off, the second controlled switch 442 is turned on and couples the energy storage device 111 with ground 452. When the second controlled switch 442 is pulse width modulated by the first PWM signal, the pass gates 444 are also pulse width modulated by the first PWM signal to prevent current from flowing from the load 114 into the drain of the second controlled switch 442.

The load 114 of the illustrated example is coupled to the input of the amplifier 100 via a feedback element 456. The feedback element 456 is implemented with a resistor $R_F$. The feedback resistor $R_F$ and the input resistor $R_1$ form a feedback network that controls the overall gain of the amplifier 100.

As described above, when the voltage of the preprocessed audio signal exceeds a threshold (i.e., exceeds the reference voltage applied to the comparator 420), the OR gate 422 conveys a high voltage that is received by the driver 108. At the same time, the OR gate 426 conveys the first PWM signal to the driver 110. The first controlled switch 432 responds to the high voltage by turning on the first controlled switch 432. In other words, the first controlled switch 432 couples the power to supply 338 with the inductor 111. At the same time, the second output of the driver 430 turns off the pass gate 434, thereby uncoupling the source of the boost device 432 from the load 114. In this configuration, the inductor 111 is in series with the power supply 438 and the load 114 via the pass gate 444. The pass gate 444 receives the first PWM signal and selectively couples and uncouples the inductor with the diode 445 to prevent current feedback from the load 114 while driving the load 114 with an amplified version of the input signal. At the same time, the driver 110 receives the second PWM signal via the OR gate 426. The pass gate 444 is configured to couple the drain of the second controlled switch 442 with the diode 445, which is further coupled to the load 114. The source of the second controlled switch 442 is also coupled to the ground 452. In this configuration, the signal delivery circuitry 113 is configured as a voltage booster or boost converter.

Conversely, when the voltage of the audio signal does not exceed the voltage of the DC bias 412 applied to the comparator 420, the OR gate 426 conveys a high voltage that is received by the driver 110. At the same time, the OR gate 422 conveys the second PWM signal to the driver 108. The second controlled switch 442 receives the high voltage and couples the inductor 111 with ground, thereby configuring the inductor 111 in parallel with the power supply 438 and the load 114. At the same time, the driver 110 turns off the pass gate 444, thereby uncoupling the drain of the second controlled switch 442 from the load 114. As mentioned above, the driver 108 receives the first PWM signal via the OR gate 422. Using the first PWM signal, driver 108 pulse width modulates the first controlled switch 432. The driver 108 also pulse width modulates the pass gate 434 to prevent current from flowing from the load 114 back into the inductor 111. In this configuration, the signal delivery circuitry 113 is configured as a voltage buck-booster or buck converter.

Turning to FIG. 5A, a schematic of an example of an equivalent circuit for the signal booster 112 when configured as a voltage booster or boost converter 500. The second controlled switch 442 is actuated and deactiated by the second PWM signal received via the OR gate 426, and the first controlled switch 432 is actuated for the duration that the signal booster 112 is configured as voltage booster 500. A voltage booster 500 increases the output voltage beyond the input voltage supply based on the duty cycle of the switch 442. In other words, the output voltage swing from the boost converter 500 is boosted to have a larger voltage swing than the power supply 438 based on the first PWM signal.

In a voltage booster 500, the switch 442 is configured to be actuated and deactuated based on the second PWM signal. When the second controlled switch 442 is closed, current flows across the second controlled switch 442 and the inductor 111 stores the electric charge. In the example of FIG. 5A, the load 114 is implemented by a piezo-electric speaker, which is a capacitive element that stores and slowly releases energy. The diode 445 and pass gates 444 prevent the charge stored in the load 114 from flowing across the switch 442 when the switch 442 is closed. The energy stored by the load 114 therefore must slowly dissipate across the load 114, thereby reducing the energy stored in the load 114. The release of energy across the load 114 audibly presents the output audio to an end user. When the switch 442 opens, current from power supply 438 flows across the pass gate 444 and the diode 445. At the same time, the inductor 111 releases the stored energy as a current, thereby causing the overall voltage swing to increase beyond the range of the voltage supply 438. In response to the increased current, the load 114 stores and dissipates energy to the ground 452. The load 114 thereby acts as a passive integrator and restores the output PWM signal as an analog signal which is audible to an end user.

Turning to FIG. 5B, schematic of an example of an equivalent circuit for the signal booster 112 when configured as a voltage buck-booster 550. The second controlled switch 432 is actuated or deactuated by based on the first PWM signal. The second controlled switch 442 is actuated for the duration that the signal booster 112 is configured as a voltage buck-booster 550. A voltage buck-booster 550 decreases the output voltage below the low output signal (i.e., the ground) based on the duty cycle of the second controlled switch 432. Additionally, the voltage buck-booster 550 produces current through the load having an inverses polarity from the current produced when the signal booster 112 is configured as a voltage buck-booster (i.e., the voltage swing will be negative). Thus, the output voltage swing from the voltage buck-booster 550 is boosted to have a larger magnitude than the power supply 438 based on the second PWM signal, however the voltage swing will be negative.

In a voltage buck-booster 550, the switch 432 is configured to actuated and deactuated based on the first PWM signal When the first controlled switch 442 is closed, current flows across the second controlled switch 442 and the inductor 111 stores the electric charge. The load 114 is implemented by a piezo-electric speaker, which is a capacitive element that stores and slowly releases energy. In the voltage buck-booster 550, current from the power supply 438 flows into the inductor 111 and stores a charge in the inductor 111. At the same time, the load 114 has a charge stored and the diode 435 prevents the load 114 from dissipating the energy across the switch 432, thereby allowing the load to slowly dissipate energy across the capacitive load. When the switch 432 opens, the power supply 438 is decoupled and the inductor releases the charge into the load 114. The load 114 accumulates and dissipates the energy released by the inductor 111. As described above, the load 114 thereby acts as a passive integrator and restores the output PWM signal as an analog signal that is audible to an end user.

Figure 6:
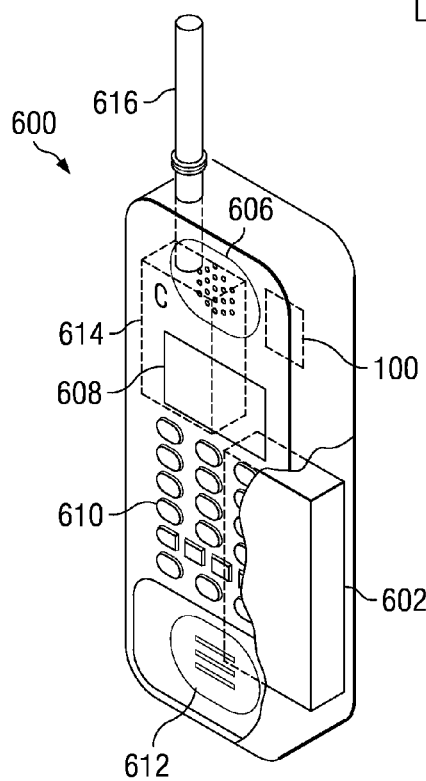
FIG. 6 illustrates an example communication device 600 that may be used to implement the example ground-referenced audio amplifier 100 of FIGS. 1A and 1B.

FIG. 6 illustrates the example ground-referenced audio amplifier 100 of FIG. 1A in an example environment of use, namely, in an example wireless communication device 600. The example wireless communication device 600 may be a mobile telephone (e.g., a cell phone, a wireless messaging device, etc.), a pager, a laptop computer, a wireless game device, an MP3 player, etc. The example wireless communication device 600 includes a processor 602, a ground-reference audio amplifier 100, a display 608, a plurality of keys (e.g., buttons) 610, and a microphone 612, all of which may be communicatively coupled to the example processor 602. In the illustrated example, the wireless communication device 600 includes a speaker 606 that is communicatively coupled to the example processor 602 via the example ground-reference audio amplifier 100.

The example wireless communication device 600 also includes a wireless communication transceiver 614 that is communicatively coupled to an antenna 616. The wireless communication transceiver 614 may be implemented using, for example, WiMAX technology, wireless Ethernet technology (e.g., 802.11(b), etc.), CDMA technology, TDMA technology, GSM technology, analog/AMPS technology, Wireless USB technology, and/or any other suitable past, present or future mobile communication technology. Then example processor is communicatively coupled to the wireless communication transceiver 614 to selectively use the wireless communication transceiver 614 to, for example, communicate with a wireless base station (not shown). The wireless communication device 600 of the illustrated example also includes other electronics hardware such as, for example, a Bluetooth® transceiver and/or an 802.11 (i.e., Wi-Fi®) transceiver, either of which may be communicatively coupled to the example processor 602.

Figure 7A:
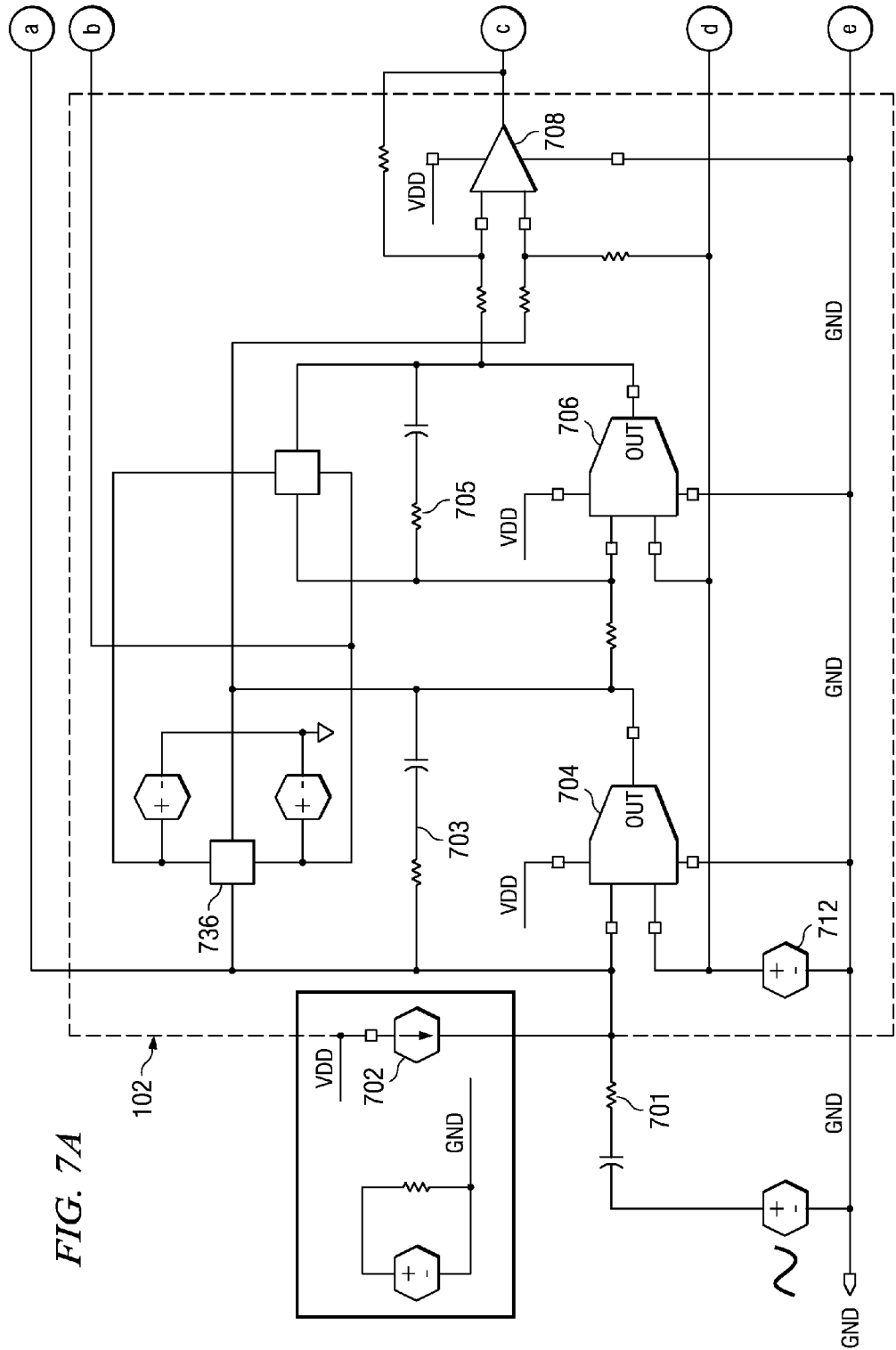
FIGS. 7A-7D together comprise a schematic diagram of an example implementation of the circuits of FIGS. 1A and/or 4.
Figure 7B:
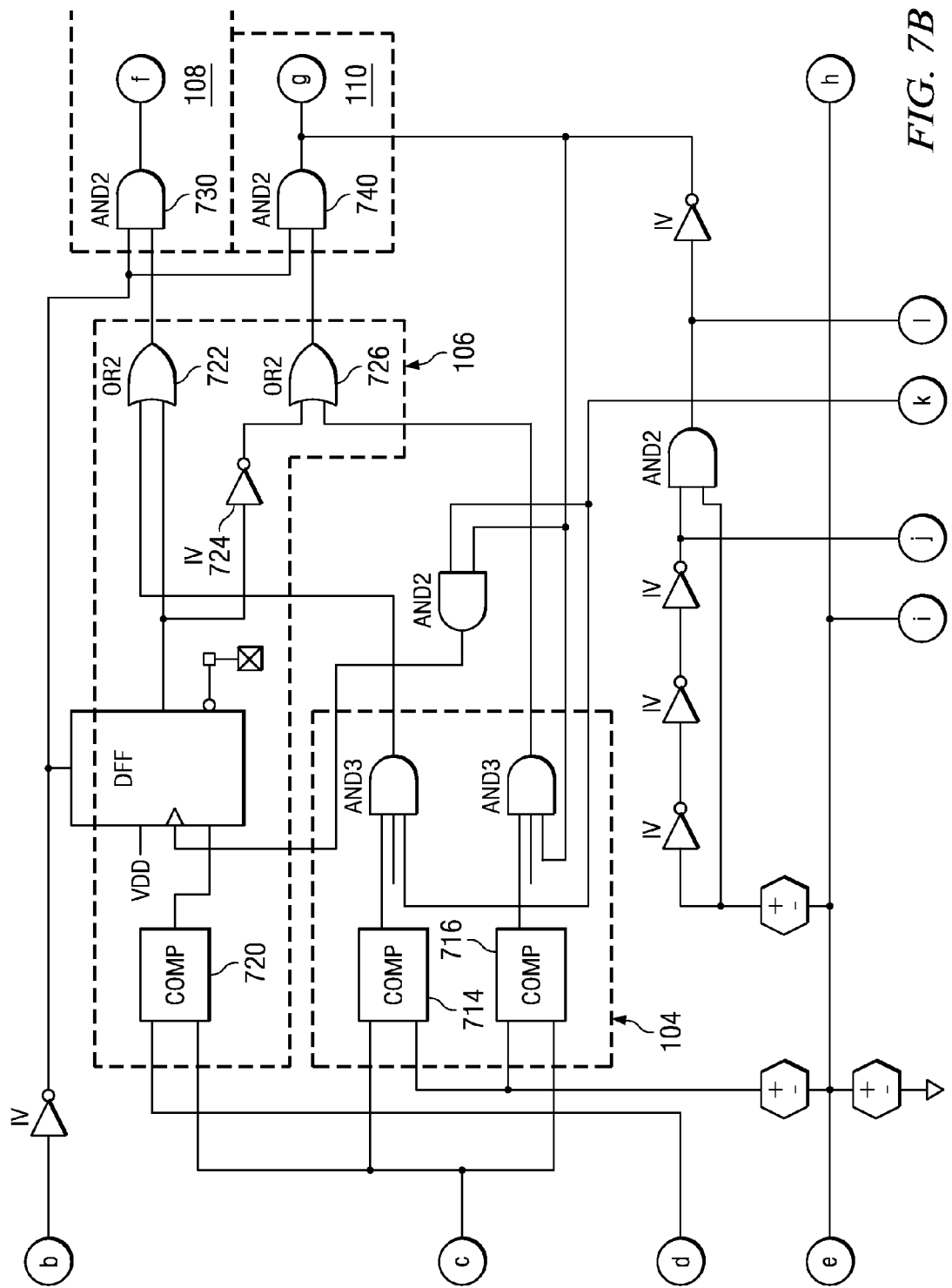

FIGS. 7A-D illustrates an example implementation of the ground-referenced audio amplifier 100 of FIGS. 1A and/or 4. The input interface 102 is implemented by a resistor 701, a level shifter 702, a first integrator 704, a second integrator 706, a summing device 708, and a DC bias 712. As described above, the input interface suppresses the noise so that substantially all of the noise is inaudible to the human ear. As illustrated in FIGS. 7A and 7B, the example input interface 102 conveys the preprocessed audio signal to the PWM 104, which includes a first comparator 714 and a second comparator 716. As described above, the first comparator produces a first PWM signal and the second comparator produces a second PWM signal. The first and second PWM signals are received by the mode selector 106. In the example of FIG. 7B, the mode selector 106 is implemented by a comparator 720, a first OR gate 722, an inverter 724, and a second OR gate 726. The mode selector 106 either conveys a high voltage or one of the first and second PWM signal as explained above.

Figure 7C:
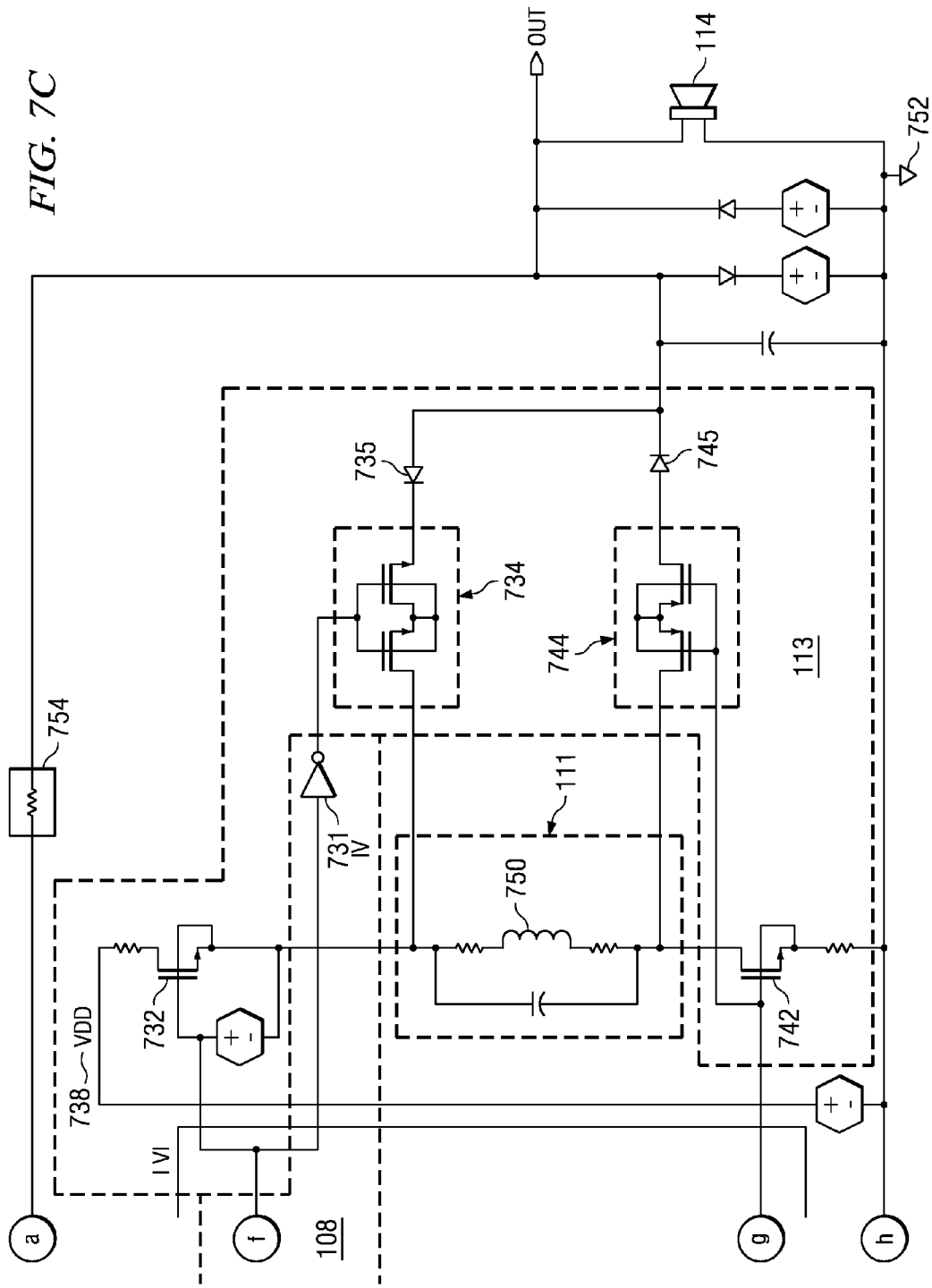

The first high-side output driver 108 receives the first PWM signal or a high voltage from the OR gate 722. In the example of FIGS. 7B and 7C, the high-side output driver 730 is implemented by an AND gate 730 and an inverter 731. The AND gate 730 forms a first output of the driver 108 and the inverter 731 forms a second output of the driver 108. The AND gate 730 also receives a signal from a current feedback device 736, which is illustrated in the example of FIG. 7B. The second high-side output driver 110 receives the second PWM signal or a high voltage from the OR gate 726. Additionally, the second high-side output driver receives a signal from the current feedback device 736.

Figure 7D:
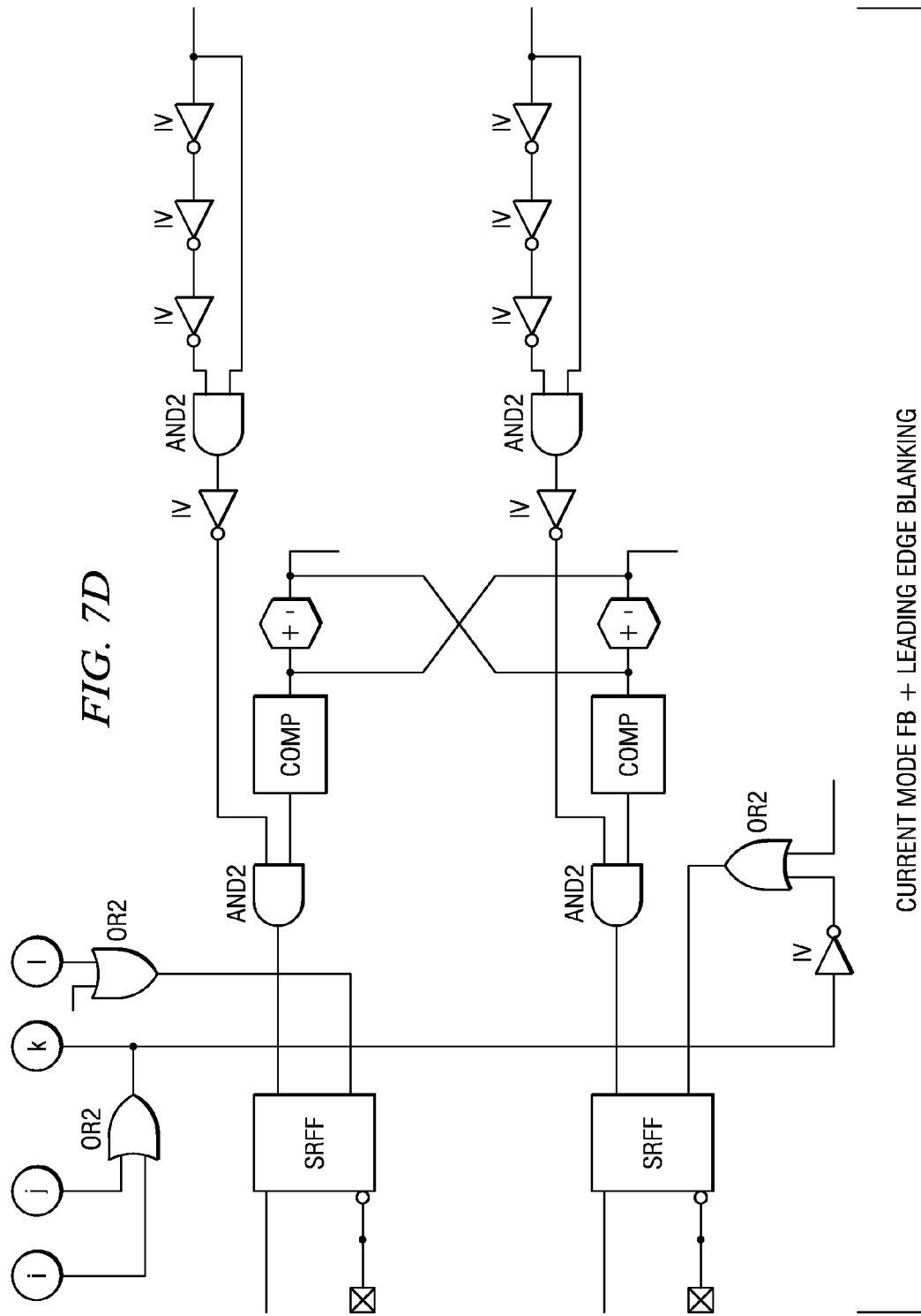

The AND gate 730 conveys either the second PWM signal or a high voltage to a first LDMOS device 432. The AND gate 740 conveys either the second PWM signal or the high voltage to a second LDMOS device 442. The first and second LDMOS transistors, along with a first pass gate 734, a second pass gate 744, a first diode 735, and a second diode 735 implement the signal delivery circuitry 113 of FIG. 1A. In the example of FIG. 7C, the energy storage device 111 is implemented by an inductor 750. The signal delivery circuitry 113 of FIG. 7C, which is powered by the power supply 738, and the inductor 750 of FIG. 7C outputs a signal representative of the input audio signal, but with a larger voltage swing than the voltage of the power supply 738. The output signal is received by the load 114, which is referenced to ground (e.g., a system ground, etc.). In addition, the example of FIG. 7 may also include a capacitor 760 to implement the signal delivery circuitry 113, but inclusion of the capacitor is dependent on the type of load 114. For example, implementing the load 114 as a piezo-electric speaker may enable elimination of the capacitor because a piezo-electric speaker is a capacitive load. The example of FIG. 7D illustrates additional devices that may be implemented to reduce voltage and current spikes in the illustrated examples. In particular, FIG. 7D illustrates a timing circuit that functions to achieve leading edge blanking to prevent switching at the highs and lows of the triangle reference signal so that the duty cycle of the first and/or second PWM signals does not go to 100%.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

What is claimed is:

1. An apparatus to amplify an audio input signal, comprising:
    a pulse width modulator that receives an input signal and that generates a first and a second pulse-width modulated (PWM) signals by comparing the input signal to a reference signal;
    a first driver;
    a second driver;
    a signal delivery circuit that is coupled to each of the first and second drivers; and
    a mode selector that is coupled to the first driver, the signal delivery circuit, and the second drivers, wherein the mode selector selectively configures the signal delivery circuit to operate in a boost mode or in a buck mode based on at least in part on a characteristic of the input signal.

2. An apparatus as defined in claim 1, wherein the characteristic of the input signal is a voltage amplitude of the input signal.

3. The apparatus as defined in claim 1, wherein the apparatus further comprises an inductor that is coupled to the signal delivery circuit.

4. The apparatus as defined in claim 1, wherein the signal delivery circuit comprises:

a first transistor having a first condition in which the first transistor couples an energy storage device to a power supply and a second condition in which the first transistor is driven by a first signal;
a first pass gate having a first state in which the first pass gate disconnects a first path between the first transistor and a load, and a second state in which the first pass gate is driven by a first signal;
a second transistor having a first condition in which the second transistor couples the energy storage device to ground and a second condition in which the second transistor is driven by the second signal; and
a second pass gate having a first state in which the second pass gate disconnects a second path between the second transistor and the load, and a second state in which the second pass gate is driven by the second signal.

5. The apparatus as defined in claim 4, wherein, when the signal delivery circuit is in the boost mode, the first transistor is in the first condition, the first pass gate is in the first state, the second transistor is in the second condition and the second pass gate is in the second state.

6. The apparatus as defined in claim 4, wherein, when the signal delivery circuit is in the buck mode, the first transistor is in the second condition, the first pass gate is in the second state, the second transistor is in the first condition and the second pass gate is in the first state.

7. The apparatus as defined in claim 1, further comprising a transducer in communication with the signal delivery circuit.

8. The apparatus as defined in claim 7, wherein the transducer is a single sided device.

9. A method to amplify an audio input signal, comprising:
    modulating the audio input signal to produce a first signal and a second signal by comparing the audio input signal to a reference signal;
    comparing a characteristic of the audio input signal to a reference;
    configuring a signal delivery circuit in a boost mode or a buck mode based on the comparison; and
    producing an output signal using one of the first or the second signals.

10. The method as defined in claim 9, wherein the first signal is a first pulse-width modulated signal, and the second signal is a second pulse-width modulated signal, and the first and second signals have opposite polarities.

11. The method as defined in claim 9, wherein the characteristic of the input signal is a voltage of the input signal.

12. The method as defined in claim 9, wherein the output signal has a voltage greater than a voltage of a power supply.

13. The method as defined in claim 9, wherein the output signal has a first voltage and a first polarity in the boost mode, and the output signal has a second voltage and a second polarity when in the buck mode, the first polarity being opposite the second polarity.

14. The method as defined in claim 9, wherein configuring the signal delivery circuit in the boost mode comprises:
    placing a first transistor in a state in which the first transistor couples an energy storage device to a power supply;
    placing a first pass gate in a state in which the first pass gate disconnects a first path between the first transistor and a load;
    placing a second transistor in a state in which the second transistor is driven by the second signal; and
    placing a second pass gate in a state in which the second pass gate is driven by the second signal.

15. The method as defined in claim 14, wherein configuring the signal delivery circuit in the buck mode comprises:

placing the first transistor in a state in which the first transistor is driven by the first signal;

placing the first pass gate in a state in which the first pass gate is driven by the first signal;

placing the second transistor in a state in which the second transistor couples the energy storage device to ground; and placing the second pass gate in a state in which the second pass gate disconnects a second path between the second transistor and the load.

16. The method as defined in claim 9, further comprising transducing the output signal of the signal delivery circuit into a humanly audible sound.

17. An apparatus comprising:
an input interface that receives an input signal;
a pulse width modulator that is coupled to input interface and that generates a first PWM signal and a second PWM signal based at least in part on a comparison of an output from the input interface with a reference signal;
a mode selector that is coupled to the input interface and to the pulse width modulator;
a first driver that is coupled to the mode selector, wherein the first driver receives the first PWM in a buck mode, and wherein the first driver receives a logic level indicating a boost mode during the boost mode;
a second driver that is coupled to the mode selector, wherein the second driver receives the second PWM in the boost mode, and wherein the first driver receives a logic level indicating the buck mode during the buck mode; and
a signal delivery circuit that is coupled to the first driver and the second driver.

18. The apparatus as defined in claim 17, wherein the apparatus further comprises an inductor that is coupled to the signal delivery circuit.

19. The apparatus as defined in claim 17, wherein the mode selector further comprises:
a comparator that is coupled to the input interface;
a first OR gate that is coupled to the comparator and the pulse width modulator, wherein the first OR gate receives the first PWM signal;
an inverter that is coupled to the comparator; and
a second OR gate that is coupled to the inverter and the pulse width modulator, wherein the second OR gate receives the second PWM signal.

20. The apparatus as defined in claim 17, wherein the signal delivery circuit further comprises:
a first transistor having a first passive electrode, a second passive electrode, and a control electrode, wherein the control electrode of the first transistor is coupled to the first driver, and wherein the first driver actuates the first transistor during the boost mode, and wherein the first driver applies the first PWM signal during the buck mode; and
a second transistor having a first passive electrode, a second passive electrode, and a control electrode, wherein the control electrode of the second transistor is coupled to the second driver, and wherein the second driver actuates the second transistor during the buck mode, and wherein the first driver applies the second PWM signal during the boost mode.

21. The apparatus as defined in claim 20, wherein the apparatus further comprises an inductor that is coupled to the second passive electrode of the first transistor and the first passive electrode of the second transistor.

22. The apparatus as defined in claim 21, wherein the signal delivery circuit further comprises:
a first pass gate that is coupled to the first driver and to the inductor;
a second pass gate that is coupled to the second driver and to the inductor;
a reverse bias diode that is coupled to the first pass gate; and
a forward bias diode that is coupled to the second pass gate.

23. The apparatus as defined in claim 17, wherein the input interface further comprises:
a first integrator that receives the input signal;
a second integrator that is coupled to the first integrator;
an amplifier that is coupled to the second integrator.

24. The apparatus as defined in claim 17, wherein the pulse width modulator further comprises:
a first comparator that is coupled to the input interface and that receives the reference signal; and
a second comparator that is coupled to the input interface and that receives the reference signal.

25. An apparatus comprising:
an input interface including:
a first integrator that receives an input signal;
a second integrator that is coupled to the first integrator; and
an amplifier that is coupled to the second integrator;
a pulse width modulator including:
a first comparator that is coupled to the amplifier, that receives a reference signal, and that generates a first PWM signal; and
a second comparator that is coupled to the amplifier, that receives the reference signal, and that generates a second PWM signal;
a mode selector including:
a third comparator that is coupled to the amplifier;
a first OR gate that is coupled to the comparator and the first comparator;
an inverter that is coupled to the third comparator; and
a second OR gate that is coupled to the inverter and the second comparator;
a first driver that is coupled to the first OR gate, wherein the first driver receives the first PWM in a buck mode, and wherein the first driver receives a logic level indicating a boost mode during the boost mode;
a second driver that is coupled to the second OR gate, wherein the second driver receives the second PWM in the boost mode, and wherein the first driver receives a logic level indicating the buck mode during the buck mode;
an inductor; and
a signal delivery circuit further including:
a first transistor having a first passive electrode, a second passive electrode, and a control electrode, wherein the control electrode of the first transistor is coupled to the first driver, and wherein the second passive electrode of the first transistor is coupled to the inductor, and wherein the first driver actuates the first transistor during the boost mode, and wherein the first driver applies the first PWM signal during the buck mode;
a second transistor having a first passive electrode, a second passive electrode, and a control electrode, wherein the control electrode of the second transistor is coupled to the second driver, and wherein the first passive electrode of the second transistor is coupled to the inductor, and wherein the second driver actuates the second transistor during the buck mode, and wherein the first driver applies the second PWM signal during the boost mode;
a first pass gate that is coupled to the first driver and to the inductor;

a second pass gate that is coupled to the second driver and to the inductor;
a reverse bias diode that is coupled to the first pass gate; and
a forward bias diode that is coupled to the second pass gate.

* * * * *